United States Patent
Wu et al.

(10) Patent No.: US 10,026,827 B2
(45) Date of Patent: Jul. 17, 2018

(54) METHOD FOR FABRICATING SEMICONDUCTOR DEVICE

(71) Applicant: UNITED MICROELECTRONICS CORP., Hsin-Chu (TW)

(72) Inventors: Zhen Wu, Kaohsiung (TW); Chiu-Hsien Yeh, Tainan (TW); Po-Wen Su, Kaohsiung (TW); Kuan-Ying Lai, Chiayi (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 24 days.

(21) Appl. No.: 15/095,154

(22) Filed: Apr. 10, 2016

(65) Prior Publication Data
US 2017/0294523 A1    Oct. 12, 2017

(51) Int. Cl.
| H01L 29/66 | (2006.01) |
| H01L 21/02 | (2006.01) |
| H01L 21/304 | (2006.01) |
| H01L 21/768 | (2006.01) |
| H01L 21/28 | (2006.01) |

(52) U.S. Cl.
CPC .. *H01L 29/66795* (2013.01); *H01L 21/02603* (2013.01); *H01L 21/28158* (2013.01); *H01L 21/304* (2013.01); *H01L 21/76897* (2013.01)

(58) Field of Classification Search
CPC .. H01L 29/0669; H01L 29/413; H01L 51/444
See application file for complete search history.

(56) References Cited

U.S. PATENT DOCUMENTS

| 2010/0151393 A1* | 6/2010 | Kim ................... B81C 1/00031 430/322 |
| 2014/0166981 A1* | 6/2014 | Doyle ............... H01L 29/66666 257/24 |
| 2014/0225184 A1 | 8/2014 | Colinge et al. |
| 2014/0356791 A1* | 12/2014 | Liu ...................... G03F 7/2059 430/296 |

* cited by examiner

*Primary Examiner* — Moazzam Hossain
*Assistant Examiner* — Hajar Kolahdouzan
(74) *Attorney, Agent, or Firm* — Winston Hsu

(57) ABSTRACT

A method for fabricating semiconductor device is disclosed. The method includes the steps of: providing a substrate; forming a first organic layer on the substrate; patterning the first organic layer to form an opening; forming a second organic layer in the opening; and removing the first organic layer to form a patterned second organic layer on the substrate.

14 Claims, 7 Drawing Sheets

US 10,026,827 B2

METHOD FOR FABRICATING SEMICONDUCTOR DEVICE

BACKGROUND OF THE INVENTION

1. Field of the Invention

The invention relates to a method for fabricating semiconductor device, and more particularly, to a method for fabricating gate-all-around (GAA) nanowire field-effect-transistor.

2. Description of the Prior Art

In the past four decades, semiconductor industries keep downscaling the size of MOSFETs in order to achieve the goals of high operation speed and high device density. However, the reduction of device size won't last forever. When transistor shrink into or below 30 nm regime, leakage current due to severe short channel effects and thin gate dielectric causes the increase of off-state power consumption, and consequently causes functionality failure. One-dimensional devices based on nanowires or nanotubes are considered the immediate successors to replace the traditional silicon technology with relatively low technological risk. Nanowire transistor, which has higher carrier mobility and can be further enhanced by quantum confinement effect, is one of the most promising devices.

Current process for fabricating nanowire transistor typically employs a tri-layer scheme to define the pattern of a nanowire. This approach however limits the critical dimension of the nanowire being fabricated. Hence, how to resolve this issue in fabrication of nanowire transistors has become an important task in this field.

SUMMARY OF THE INVENTION

It is therefore an objective of the present invention to provide a method for fabricating a gate-all-around nanowire FET device for resolving the aforementioned issue.

According to a preferred embodiment of the present invention, a method for fabricating semiconductor device is disclosed. The method includes the steps of: providing a substrate; forming a first organic layer on the substrate; patterning the first organic layer to form an opening; forming a second organic layer in the opening; and removing the first organic layer to form a patterned second organic layer on the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-13 illustrate a method for fabricating a gate-all-around (GAA) nanowire FET device according to a preferred embodiment of the present invention, in which:

FIG. 1 illustrates a step of forming a first organic layer and a patterned mask on a substrate;

FIG. 2 illustrates a step of patterning the first organic layer;

FIG. 3 illustrates a step of forming a second organic layer on the first organic layer;

FIG. 4 illustrates a step of planarizing the second organic layer;

FIG. 5 illustrates a step of removing the second organic layer;

FIG. 6 illustrates a step of forming a nanowire on the substrate;

FIG. 7 illustrates a step of forming a source region and a first insulating layer on the substrate;

FIG. 8 illustrates a step of trimming part of the nanowire;

FIG. 9 illustrates a step of forming a high-k dielectric layer and a work function metal layer;

FIG. 10 illustrates a step of removing part of the work function metal layer and part of the high-k dielectric layer;

FIG. 11 illustrates a step of forming a second insulating layer on the work function metal layer;

FIG. 12 illustrates a step of forming a drain region; and

FIG. 13 illustrates a step of forming a third insulating layer and contact plugs.

DETAILED DESCRIPTION

Figure 1:
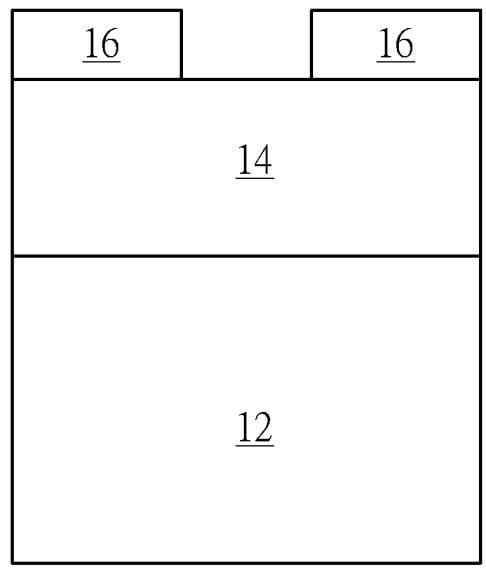

Referring to FIGS. 1-13, FIGS. 1-13 illustrate a method for fabricating a gate-all-around (GAA) nanowire FET device according to a preferred embodiment of the present invention. As shown in FIG. 1, a target layer, such as a substrate 12 is provided. The substrate may include bulk silicon. Alternatively, an elementary semiconductor, such as a silicon or germanium in a crystalline structure, may also be included in the substrate 12. The substrate 12 may also include a compound semiconductor, such as silicon germanium, silicon carbide, gallium arsenic, gallium phosphide, indium phosphide, indium arsenide, and/or indium antimonide, or combinations thereof. Other possible substrate 12 also includes a semiconductor-on-insulator substrate, such as silicon-on-insulator (SOI), SiGe-On-Insulator (SGOI), Ge-On-Insulator substrates. For example, the SOI substrates may be fabricated using separation by implantation of oxygen (SIMOX), wafer bonding, and/or other suitable methods.

After the substrate 12 is provided, a first organic layer 14 is formed on the substrate 12, and a patterned mask, such as a patterned resist 16 is formed on the first organic layer 14.

Figure 2:
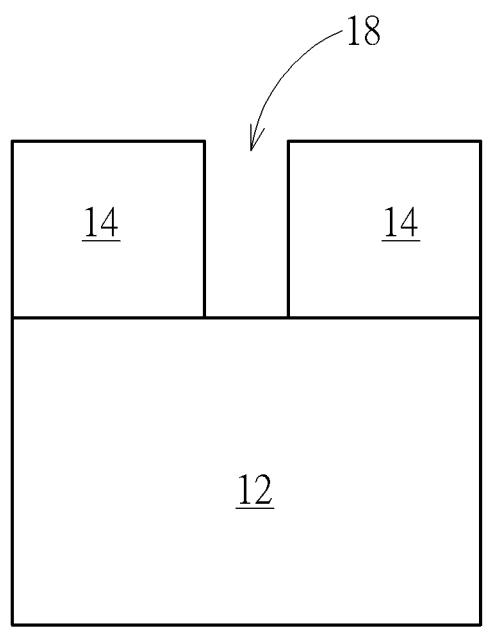

Next, as shown in FIG. 2, an etching process, such as a dry etching process is conducted by using the patterned resist 16 as mask to remove or pattern part of the first organic layer 14. This forms an opening 18 in the patterned first organic layer 14 and exposes part of the substrate 12 surface.

Figure 3:
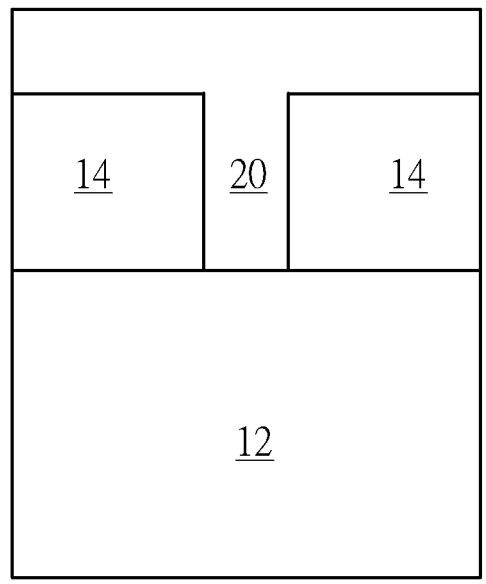

Next, as shown in FIG. 3, a second organic layer 20 is formed on the patterned first organic layer 14. Preferably, the second organic layer 20 is not only formed on the top surface of the patterned first organic layer 14 but also filling the opening 18 completely.

In this embodiment, the first organic layer 14 and the second organic layer 20 are composed of different material, in which the first organic layer 14 is preferably a mold-bottom antireflective coating (mold-BARC) while the second organic layer 20 is a mask-bottom antireflective coating (mask-BARC). Nevertheless, it would be desirable to use any other organic material for constituting the first organic layer 14 and the second organic layer 20 as long as the two layers 14 and 20 share an etching selectivity therebetween.

In addition, the second organic layer 20 preferably contains more acidic functional groups than the first organic layer 14 in this embodiment. For instance, the second organic layer 20 preferably contains more OH functional group than the first organic layer 14, and in this embodiment, examples of the first organic layer 14 are selected from the group consisting of 85-95% of methyl 2-hydroxyisobutyrate and 1-10% of propylene glycol methyl ether acetate and examples of the second organic layer 20 are selected from the group consisting of 60-70% of propylene glycol monomethyl ether and 20-30% of propylene glycol monomethyl ether acetate, but not limited thereto.

Figure 4:
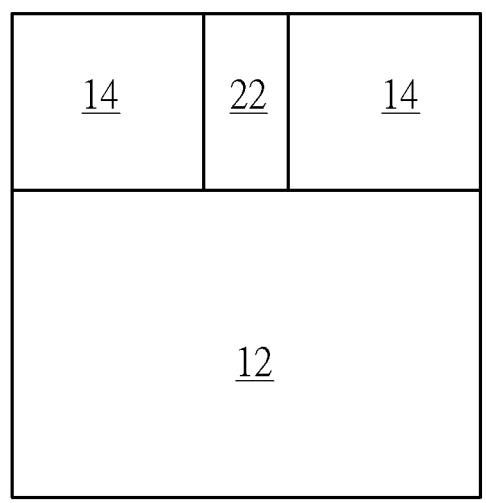

Next, as shown in FIG. 4, a planarizing process, such as an etching back process is conducted to remove part of the second organic layer 20 so that the top surfaces of the patterned first organic layer 14 is even with the top surface of the remaining or patterned second organic layer 22.

Figure 5:
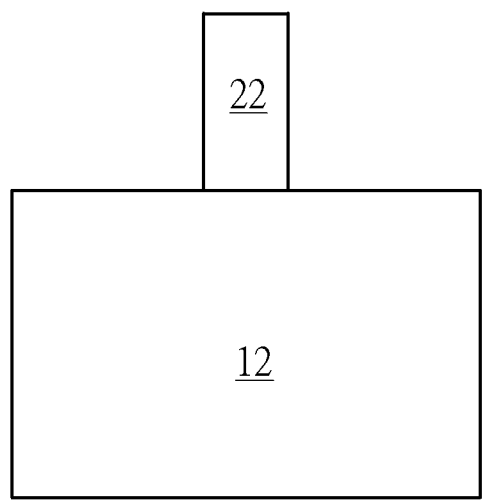

Next, as shown in FIG. 5, another etching process, such as a wet etching process is conducted to remove the patterned first organic layer 14 completely. It should be noted that since the first organic layer 14 and the second organic layer 20 are composed of different material, the wet etching process could be accomplished by using the etching selectivity shared between the two layers 14 and 20 to remove the patterned first organic layer 14 without utilizing an extra patterned mask. This leaves the patterned second organic layer 22 on the substrate 12 and exposes part of the top surface of the substrate 12 adjacent to two sides of the patterned second organic layer 22.

According to a preferred embodiment of the present invention, the removal of the patterned first organic layer 14 is accomplished by immersing the substrate 12 in an aqueous solution, in which the aqueous solution preferably includes an ammonium hydroxide/hydrogen peroxide/deionized water mixture, but not limited thereto.

Figure 6:
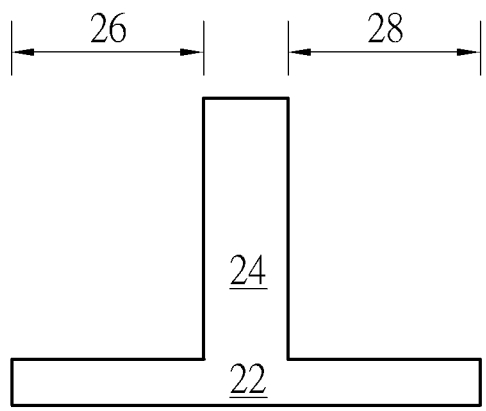

Next, as shown in FIG. 6, another etching process is conducted by using the patterned second organic layer 22 as mask to remove part of the substrate 12. This forms a nanowire 24 on the substrate 12 and at the same time defines a first region 26 adjacent to one side of the nanowire 24 and a second region 28 adjacent to another side of the nanowire 24. The patterned second organic layer 22 is then removed thereafter.

In addition to using the first organic layer 14 and the second organic layer 20 to pattern the substrate 12 for forming a nanowire 24, it would also be desirable to apply the aforementioned patterning process to pattern various target materials such as polysilicon or metal layer according to an embodiment of the present invention. For instance, a target layer including a metal layer or polysilicon layer could be first provided, the aforementioned patterning of the first organic layer and second organic layer conducted from FIGS. 1-5 could be carried out to form a patterned second organic layer on the target layer, and the patterned second organic layer is then used as mask to remove part of the target layer for forming a patterned target layer. If the target layer were composed of metal, it would be desirable to use the patterned metal layer for fabricating metal lines such as metal interconnections, where as if the target layer were composed of polysilicon, it would be desirable to use the patterned polysilicon layer for fabricating gate lines, which are all within the scope of the present invention.

Figure 7:
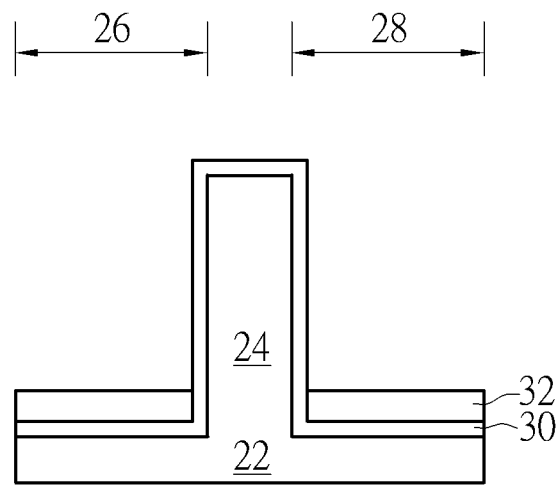

After the nanowire 24 is formed, as shown in FIG. 7, a doped region, such as a source region 30 is formed on the first region 26 and the second region 28 of the substrate 12 and on the nanowire 24. Preferably, the formation of the source region 30 could be accomplished by conducting an ion implantation process to implant n-type or p-type dopants into the substrate 12 and the nanowire 24 for forming a doped region. The doped region then serves as the source region 30 for the nanowire transistor formed afterwards.

It should be noted that instead of conducting an ion implantation process to form the source region 30, it would also be desirable to use other means, such as using an epitaxial growth process to form an epitaxial layer on the substrate 12 and the nanowire 24 for serving as the source region 30, which is also within the scope of the present invention.

After the source region 30 is formed, a first insulating layer 32 is formed on the source region 30, in which the first insulating layer 32 is preferably composed of silicon oxide. In this embodiment, the formation of the first insulating layer 32 could be accomplished by depositing a first insulating layer (not shown) on the first region 26 and the second region 28 and covering the nanowire 24 entirely, and then removing part of the first insulating layer through an etching back process or a combination of planarizing process and etching back process so that the top surface of the remaining first insulating layer 32 is lower than the top surface of the nanowire 24.

Figure 8:
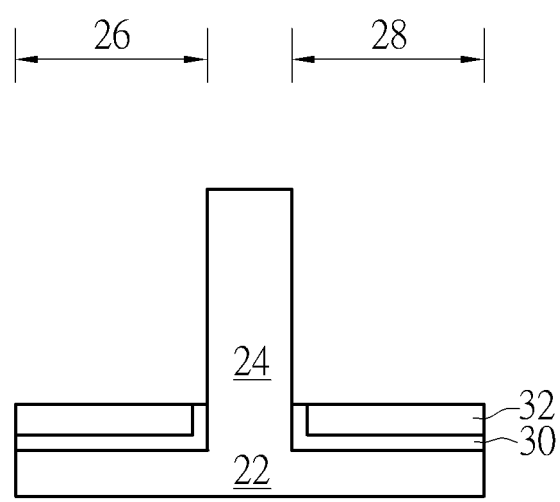

Next, as shown in FIG. 8, an etching process is conducted to trim part of the nanowire 24 by removing part of the source region 30. Specifically, parts of the source region 30 formed on the top surface and sidewalls of the nanowire 24 are removed so that the top surface of the remaining source region 30 is even with the top surface of the first insulating layer 32.

Figure 9:
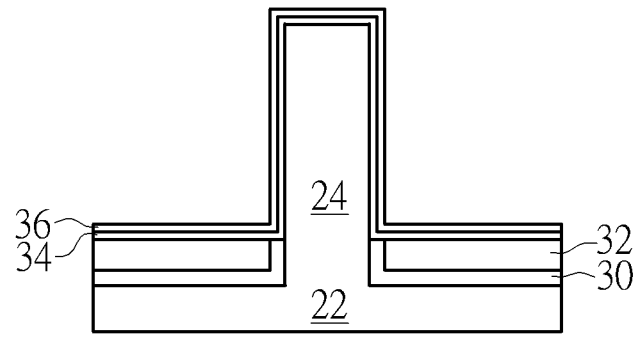

Next, as shown in FIG. 9, an optional interfacial layer (not shown), a high-k dielectric layer 34, a work function metal layer 36, and an optional low resistance metal layer are sequentially deposited on the first insulating layer 32 and the nanowire 24.

In this embodiment, the high-k dielectric layer 34 is preferably selected from dielectric materials having dielectric constant (k value) larger than 4. For instance, the high-k dielectric layer 34 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 36 is formed for tuning the work function of the later formed metal gates to be appropriate in an NMOS transistor or a PMOS transistor. For a NMOS transistor, the work function metal layer 36 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), titanium aluminum carbide (TiAlC), or combination thereof, but not limited thereto. For a PMOS transistor, the work function metal layer 36 having a work function ranging between 4.8 eV and 5.2 eV may include titanium nitride (TiN), tantalum nitride (TaN), tantalum carbide (TaC), or combination thereof, but not limited thereto. An optional barrier layer (not shown) could be formed between the work function metal layer 36 and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Figure 10:
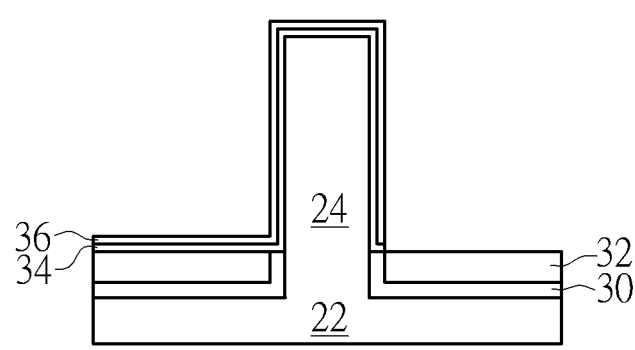

Next, as shown in FIG. 10, a photo-etching process is conducted to remove part of the work function metal layer 36 and part of the high-k dielectric layer 34 on the second region 28 and expose the first insulating layer 32 underneath.

Figure 11:
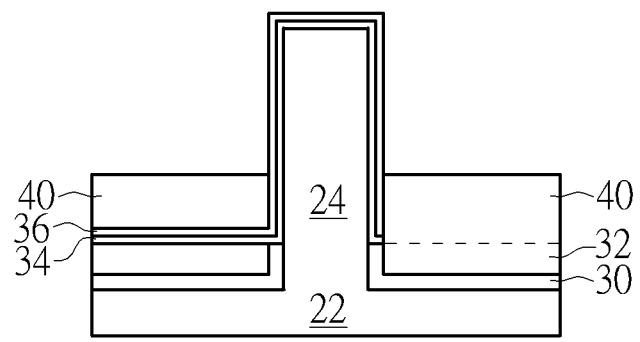

Next, as shown in FIG. 11, a second insulating layer 40 is formed on the work function metal layer 36 on the first region and the first insulating layer 32 on the second region 28. Preferably, the formation of the second insulating layer 40 could be accomplished by depositing a second insulating layer (not shown) on the first region 26 and the second region 28 and covering the nanowire 24 entirely, and then removing part of the second insulating layer through an etching back process or a combination of planarizing process and etching back process so that the top surface of the remaining second insulating layer 40 is lower than the top surface of the nanowire 24.

In this embodiment, the second insulating layer 40 and the first insulating layer 32 are preferably composed of same material, such as both being composed of silicon oxide. Nevertheless, it would also be desirable to use different dielectric material, such as other oxide-containing material for the second insulating layer 40 depending on the demand of the product, which is also within in the scope of the present invention.

Figure 12:
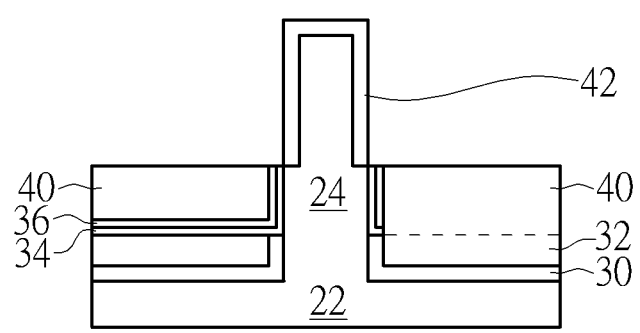

Next, as shown in FIG. 12, an etching process is conducted to remove part of the work function metal layer 36 and part of the high-k dielectric layer 34 and expose part of the nanowire 24 underneath. Specifically, part of the work function metal layer 36 and part of the high-k dielectric layer 34 on the top surface of the nanowire 24 and sidewalls of the nanowire 24 are removed so that a top surface of the remaining work function metal layer 36 is even with a top surface of the second insulating layer 40. Preferably, the remaining high-k dielectric layer 34 and work function metal layer 36 will serve as a gate layer for the nanowire transistor formed afterward.

Next, an ion implantation process is conducted by implanting n-type or p-type dopants into the top surface and sidewalls of the nanowire 24 for forming another doped region, such as a drain region 42. It is to be noted that the dopants implanted into the nanowire 24 for forming the drain region 42 are preferably the same as the ones implanted previously for forming the source region 30. However it would also be desirable to implant different dopants but with same conductive type to form the drain region 42, which is also within the scope of the present invention.

Similar to the aforementioned process for forming the source region 30, instead of conducting an ion implantation process to form the drain region 42, it would also be desirable to use other means, such as using an epitaxial growth process to form an epitaxial layer on the top surface and sidewalls of the nanowire 24 for serving as the drain region 42, which is also within the scope of the present invention.

Figure 13:
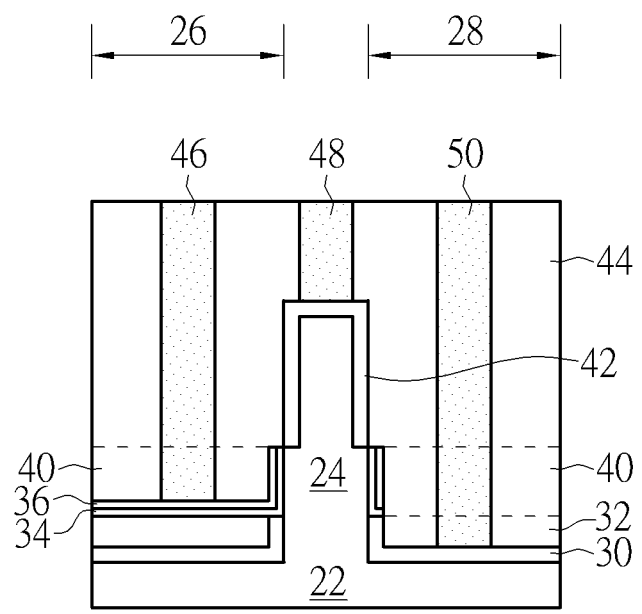

Next, as shown in FIG. 13, a third insulating layer 44 is formed on the second insulating layer 40 and the drain region 42. In this embodiment, the third insulating layer 44, the second insulating layer 40 and the first insulating layer 32 are preferably composed of same material, such as all being composed of silicon oxide. However, it would also be desirable to use a different dielectric material for the third insulating layer 44 depending on the demand of the product, which is also within in the scope of the present invention.

Next, a contact plug formation process is conducted to form a contact plug 46 in the third insulating layer 44 and the second insulating layer 40 to electrically connect to the work function metal layer 36, a contact plug 48 in the third insulating layer 44 to electrically connect to the drain region 42, and a contact plug 50 in the third insulating layer 44, the second insulating layer 40, and the first insulating layer 32 to electrically connect to the source region 30.

In this embodiment, the formation of the contact plugs 46, 48, 50 could be accomplished by first forming a plurality of contact holes (not shown) in the insulating layers 32, 40, 44 to expose the work function metal layer 36, drain region 42, and source region 30 respectively, sequentially depositing a barrier layer (not shown) and a metal layer (not shown) in the contact holes, and then conducting a planarizing process, such as chemical mechanical polishing (CMP) process to remove part of the metal layer, part of the barrier layer, and even part of the third insulating layer 44. This forms contact plugs 46, 48, 50 in the contact holes, in which the top surfaces of the contact plugs 46, 48, 50 and the third insulating layer 44 are coplanar. In this embodiment, the barrier layer preferably selected from the group consisting of Ti, Ta, TiN, TaN, and WN, and the metal layer 30 is preferably selected from the group consisting of Al, Ti, Ta, W, Nb, Mo, and Cu. This completes the fabrication of a GAA nanowire transistor according to a preferred embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate;
    forming a first organic layer on the substrate;
    patterning the first organic layer to form an opening;
    forming a second organic layer in the opening, wherein the second organic layer contains more acidic functional groups than the first organic layer;
    removing the first organic layer to form a patterned second organic layer on the substrate; and
    using the patterned second organic layer to remove part of the substrate for forming a nanowire after removing the first organic layer to form the patterned second organic layer, wherein the substrate comprises a first region adjacent to one side of the nanowire and a second region adjacent to another side of the nanowire.

2. The method of claim 1, further comprising:
    forming the second organic layer on the first organic layer and filling the opening completely; and
    removing part of the second organic layer so that the top surfaces of the first organic layer and the second organic layer are coplanar.

3. The method of claim 1, wherein the substrate comprises a metal layer, the method further comprises:
    using the patterned second organic layer as mask to remove part of the metal layer for forming a patterned metal layer.

4. The method of claim 1, further comprising:
    forming a source region on the first region and the second region of the substrate and on the nanowire;
    forming a first insulating layer on the source region;
    trimming part of the nanowire;
    forming a high-k dielectric layer on the first insulating layer and the nanowire;
    forming a work function metal layer on the high-k dielectric layer;
    removing the work function metal layer on the second region;

forming a second insulating layer on the work function metal layer on the first region and the first insulating layer on the second region;

removing part of the work function metal layer on the nanowire;

forming a drain region on part of the nanowire; and forming a third insulating layer on the second insulating layer and the drain region.

5. The method of claim 4, further comprising trimming part of the nanowire so that a top surface of the source region is even with a top surface of the first insulating layer.

6. The method of claim 4, further comprising removing part of the work function metal layer on the nanowire so that a top surface of the work function metal layer is even with a top surface of the second insulating layer.

7. The method of claim 4, wherein the first insulating layer, the second insulating layer, and the third insulating layer comprise same material.

8. The method of claim 4, further comprising forming a contact plug in the third insulating layer and the second insulating layer to electrically connect to the work function metal layer.

9. The method of claim 4, further comprising forming a contact plug in the third insulating layer to electrically connect to the drain region.

10. The method of claim 4, further comprising forming a contact plug in the third insulating layer, the second insulating layer, and the first insulating layer to electrically connect to the source region.

11. The method of claim 1, wherein the first organic layer and the second organic layer comprise different material.

12. The method of claim 1, wherein the step of removing the first organic layer comprises immersing the substrate in an aqueous solution.

13. The method of claim 12, wherein the aqueous solution comprises an ammonium hydroxide/hydrogen peroxide/deionized water mixture.

14. The method of claim 1, wherein the step of forming the second organic layer in the opening the first organic layer directly contacts with the second organic layer.

* * * * *